(12) United States Patent
Tu et al.

(10) Patent No.: US 10,012,899 B2
(45) Date of Patent: Jul. 3, 2018

(54) GRAPHENE PELLICLE FOR EXTREME ULTRAVIOLET LITHOGRAPHY

(71) Applicant: Taiwan Semiconductor Manufacturing Co., Ltd., Hsin-Chu (TW)

(72) Inventors: Chih-Chiang Tu, Tauyen (TW); Chun-Lang Chen, Tainan County (TW); Chue San Yoo, Hsin-Chu (TW); Jong-Yuh Chang, Hsinchu County (TW); Chia-Shiung Tsai, Hsin-Chu (TW); Ping-Yin Liu, Taipei County (TW); Hsin-Chang Lee, Hsinchu County (TW); Chih-Cheng Lin, Kaohsiung (TW); Yun-Yue Lin, Hsinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 43 days.

(21) Appl. No.: 15/356,204

(22) Filed: Nov. 18, 2016

(65) Prior Publication Data

US 2018/0059534 A1    Mar. 1, 2018

Related U.S. Application Data

(60) Provisional application No. 62/382,579, filed on Sep. 1, 2016, provisional application No. 62/382,542, filed on Sep. 1, 2016.

(51) Int. Cl.
| | |
|---|---|
| *G03F 1/62* | (2012.01) |
| *G03F 1/64* | (2012.01) |
| *H01L 21/033* | (2006.01) |
| *C23C 14/16* | (2006.01) |
| *C23C 16/26* | (2006.01) |
| *C23C 28/00* | (2006.01) |
| *C23C 14/18* | (2006.01) |

(52) U.S. Cl.
CPC ............ *G03F 1/62* (2013.01); *G03F 1/64* (2013.01); *H01L 21/0332* (2013.01); *H01L 21/0335* (2013.01); *H01L 21/0337* (2013.01); *C23C 14/16* (2013.01); *C23C 14/18* (2013.01); *C23C 16/26* (2013.01); *C23C 28/32* (2013.01)

(58) Field of Classification Search
CPC ......... G03F 1/62; G03F 1/64; H01L 21/0332; H01L 21/0335; H01L 21/0337; C23C 14/16; C23C 14/18; C23C 16/26; C23C 28/32

USPC .......................................................... 430/5
See application file for complete search history.

(56) References Cited

U.S. PATENT DOCUMENTS

| | | | |
|---|---|---|---|
| 6,841,317 | B2 | 1/2005 | Wang |
| 8,724,088 | B2 | 5/2014 | Lin et al. |
| 9,418,847 | B2 | 8/2016 | Shen et al. |
| 2006/0246234 | A1 | 11/2006 | Meyers et al. |
| 2006/0263703 | A1 | 11/2006 | Zhang et al. |
| 2011/0244395 | A1 | 10/2011 | Huang et al. |
| 2012/0308922 | A1 | 12/2012 | Lin et al. |
| 2015/0212419 | A1 | 7/2015 | Shen et al. |
| 2017/0003585 | A1 | 1/2017 | Lin et al. |

FOREIGN PATENT DOCUMENTS

| | | |
|---|---|---|
| CN | 203324647 | 12/2013 |
| KR | 10-2008-0062746 | 8/2009 |
| TW | 200832050 | 8/2008 |
| TW | 201510638 | 3/2015 |
| TW | 201516557 | 5/2015 |
| WO | WO2010041508 | 4/2010 |

OTHER PUBLICATIONS

L. Baraton et al. "On the mechanisms of precipitation of graphene on nickel thin films" EPL, European Physical Society/EDP Science/Societa Italians di Fisica/IOP Publishing, 2011, 96, pp. 46003 (7 Pages).
U.S. Appl. No. 14/754,902, filed Jun. 30, 2015 by inventors Kuan-Wen Lin, Sheng-Chi Chin, Ting-Hao Hsu, Tzu-Ting Chou, Shu-Hsien Wu, for "Mask Pellicle Indicator, for Haze Prevention" 13pages of text, 4 pages of drawings.
Masaru Kobayashi et al., "Photocatalytic Activity of Titanium Dioxide and Zinc Oxide", Cosmetics & Toiletries Magazine, vol. 112, Allured Publishing Corp., U.S. Cosmetics Corp, Dayville, CT, USA, Jun. 1997, pp. 83-85.

*Primary Examiner* — Christopher G Young
(74) *Attorney, Agent, or Firm* — Haynes and Boone, LLP

(57) ABSTRACT

A method includes depositing a first material layer over a first substrate; and depositing a graphene layer over the first material layer. The method further includes depositing an amorphous silicon layer over the graphene layer and bonding the amorphous silicon layer to a second substrate, thereby forming an assembly. The method further includes annealing the assembly, thereby converting the amorphous silicon layer to a silicon oxide layer. The method further includes removing the first substrate from the assembly and removing the first material layer from the assembly, thereby exposing the graphene layer.

20 Claims, 5 Drawing Sheets

GRAPHENE PELLICLE FOR EXTREME ULTRAVIOLET LITHOGRAPHY

PRIORITY

This claims the benefits of U.S. Prov. App. Ser. No. 62/382,579, entitled "Graphene Pellicle for Extreme Ultraviolet Lithography," filed Sep. 1, 2016, the entire disclosure of which is incorporated herein by reference. This also claims the benefits of U.S. Prov. App. Ser. No. 62/382,542, entitled "Graphene Pellicle for Extreme Ultraviolet Lithography," filed Sep. 1, 2016, the entire disclosure of which is incorporated herein by reference.

BACKGROUND

As the semiconductor industry progresses into nanometer technology in pursuit of higher device density, higher performance, and lower costs, stricter demands have been placed on the lithography tools used in semiconductor manufacturing. Techniques such as extreme ultraviolet (EUV) lithography have been utilized to support critical dimension (CD) requirements of smaller IC devices. EUV lithography uses radiation in the EUV region, having a wavelength of about 1-100 nm, such as 13.5 nm, which is much shorter than the wavelengths in the deep ultraviolet (DUV) lithography (e.g., 193 nm lithography). EUV lithography uses masks (or reticles) that reflect EUV radiation from a radiation source towards a target (such as a silicon wafer), thereby transferring patterns from the masks to the target. Any defect on the surface of a EUV mask (as well as defects embedded in the EUV mask) may cause imaging defects on the target. Therefore, it is important to protect the EUV mask surface during lithography processes.

Unlike the masks used in DUV lithography, which traditionally employ a pellicle to protect the mask surface, it is currently difficult to manufacture an effective pellicle for EUV masks on a large scale. One reason is that the wavelength of the EUV radiation is very short and membranes of traditional pellicles would absorb the EUV radiation so much that they would deform due to excessive heat after few uses and also would substantially reduce the EUV energy reaching the target. Improvements in these areas are desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
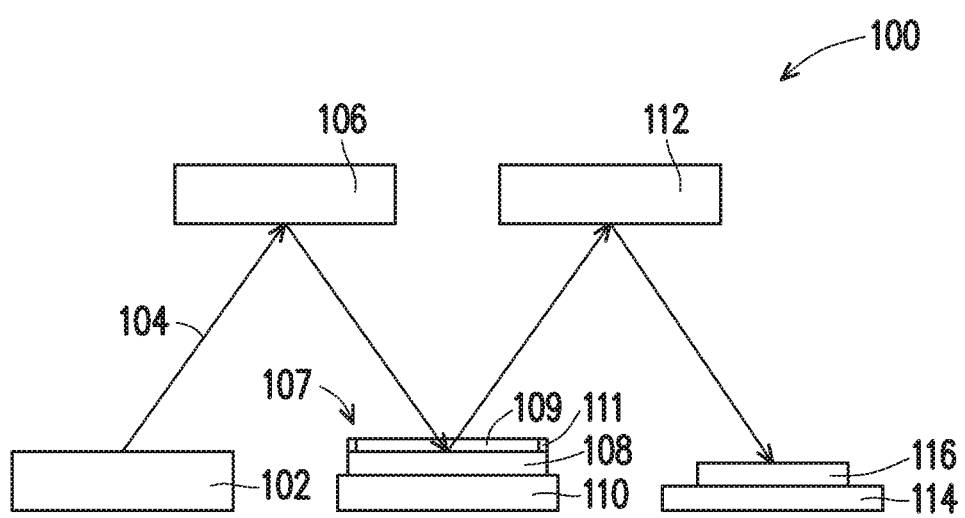
FIG. 1 is a simplified schematic diagram of a lithography system that may benefit from various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to apparatuses for semiconductor fabrication. More particularly, the present disclosure is related to a pellicle membrane for use in EUV lithography and methods of making the pellicle membrane. According to the present disclosure, the new pellicle membrane comprises a graphene layer, which may be a single layer graphene or a multilayer graphene (including bilayer and more than two layers). Graphene is fundamentally one single layer of graphite, a layer of $sp^2$-bonded carbon atoms arranged in a honeycomb (hexagonal) lattice. Graphene possesses extraordinary properties that are suitable for EUV lithograph. For example, a graphene layer can be made very thin, such as few nanometers (nm) to few tens of nanometers. In addition, graphene is the strongest material ever recorded, more than forty times stronger than diamond. Further, graphene conducts heat and electricity efficiently and is nearly transparent. Though with these extraordinary properties, graphene has not been mass-produced as EUV pellicle membranes. One challenge is that it has been difficult to extract a single or few layer graphene on a large scale without causing damages (e.g., wrinkles and/or breakages) to the graphene. To be used as a EUV pellicle membrane, a graphene layer should be smooth, with as few wrinkles as possible. Otherwise, the wrinkles not only affect lithography imaging but also become a source of deformation for the pellicle membrane. The present disclosure provides a novel process of making a smooth graphene layer on a large scale.

For the convenience of discussion, the present disclosure uses the term "a material layer" to refer to a layer comprising the material. As such, the material layer may comprise other element(s) or ingredient(s) besides the particular material. For example, "a nickel layer" refers to a layer comprising nickel even though the layer may additionally comprise other element(s). In addition, "a silicon substrate" refers to a substrate comprising silicon even though the substrate may additionally comprise element(s) other than silicon.

FIG. 1 shows an exemplary EUV lithography system 100 that can benefit from one or more embodiments of the present disclosure. The system 100 includes a radiation source 102 that produces a radiation beam 104, condenser optics 106, a mask 108 on a mask stage 110, a pellicle assembly 107 disposed on the mask 108 and having a pellicle membrane 109 mounted on a pellicle frame 111, projection optics 112, and a target 116 on a target stage 114. Other configurations and inclusion or omission of items may be possible. In the present disclosure, the system 100 may be a stepper or a scanner.

In the present embodiment, the radiation source 102 provides the radiation beam 104 having a wavelength in the EUV range, such as about 1-100 nm. In an embodiment, the radiation beam 104 has a wavelength of about 13.5 nm. The condenser optics 106 includes a multilayer coated collector and a plurality of grazing mirrors. The condenser optics 106 is configured to collect and shape the radiation beam 104 and to provide a slit of the EUV beam 104 to the mask 108.

The mask 108, also referred to as a photomask or a reticle, includes patterns of one or more target IC devices. The mask 108 provides a patterned aerial image to the radiation beam 104. The mask 108 is a reflective mask in the present embodiment, and may incorporate resolution enhancement techniques such as phase-shifting mask (PSM) and/or optical proximity correction (OPC). The pellicle frame 111 is a rigid frame. In an embodiment, the pellicle frame 111 is made of anodized aluminum alloy. The pellicle membrane 109 comprises a graphene layer in the present embodiment. The pellicle membrane 109 protects the surface of the mask 108 from external contaminants. Due to different depth of focus (DOF), impurities on the surface of the pellicle membrane 109 do not affect the patterned aerial image generated by the mask 108. The mask stage 110 secures the mask 108 thereon, such as by vacuum, and provides accurate position and movement of the mask 108 during alignment, focus, leveling and exposure operation in the EUV lithography system 100.

The projection optics 112 includes one or more lens and a plurality of mirrors. The lens may have a magnification of less than one thereby reducing the patterned aerial image of the mask 108 to the target 116. In an embodiment, the target 116 includes a semiconductor wafer with a photoresist (or resist) layer coated thereon, which is sensitive to the radiation beam 104. The target 116 is secured by the substrate stage 114 which provides accurate position and movement of the target 116 during alignment, focus, leveling and exposing operation in the EUV lithography system 100 such that the patterned aerial image of the mask 108 is exposed onto the target 116 in a repetitive fashion (though other lithography methods are possible). After the target 116 is exposed to the radiation beam 104, it is moved to other tools for further processing. For example, the target 116 may undergo resist developing and various etching processes in order to form the target IC devices.

The pellicle membrane 109 plays an important role in the EUV lithography system 100, as it reduces imaging defects and prolongs the usable life of the mask 108. Traditional pellicle membranes (e.g., those used in DUV lithography) are typically made of nitrocellulose, fluororesin, plastic resin, synthetic quartz glass, or the like; and are typically few microns thick. Those pellicle membranes cannot be practically used in EUV lithography due to their excessive absorption of EUV radiation. In the present embodiment, the pellicle membrane 109 comprises a graphene layer (or a graphene film), which is thinner and stronger than the traditional DUV pellicle membranes. However, it has been difficult to extract a graphene layer for the purposes of EUV pellicle without causing damages to the graphene layer. A common damage to a graphene layer is breaking and/or wrinkling the graphene layer during the extraction process. Due to its large surface energy and out of plane ductility, flat graphene films without structural support are unstable with respect to scrolling, i.e. bending into a cylindrical shape. The present disclosure provides a new and improved process for making a graphene layer which is substantially wrinkle-free and flat. The new and improved process can be used for manufacturing graphene layers for the purposes of EUV pellicle in a large volume. Of course, the use of these graphene layers is not limited to pellicle membranes, EUV or otherwise.

Figure 2:
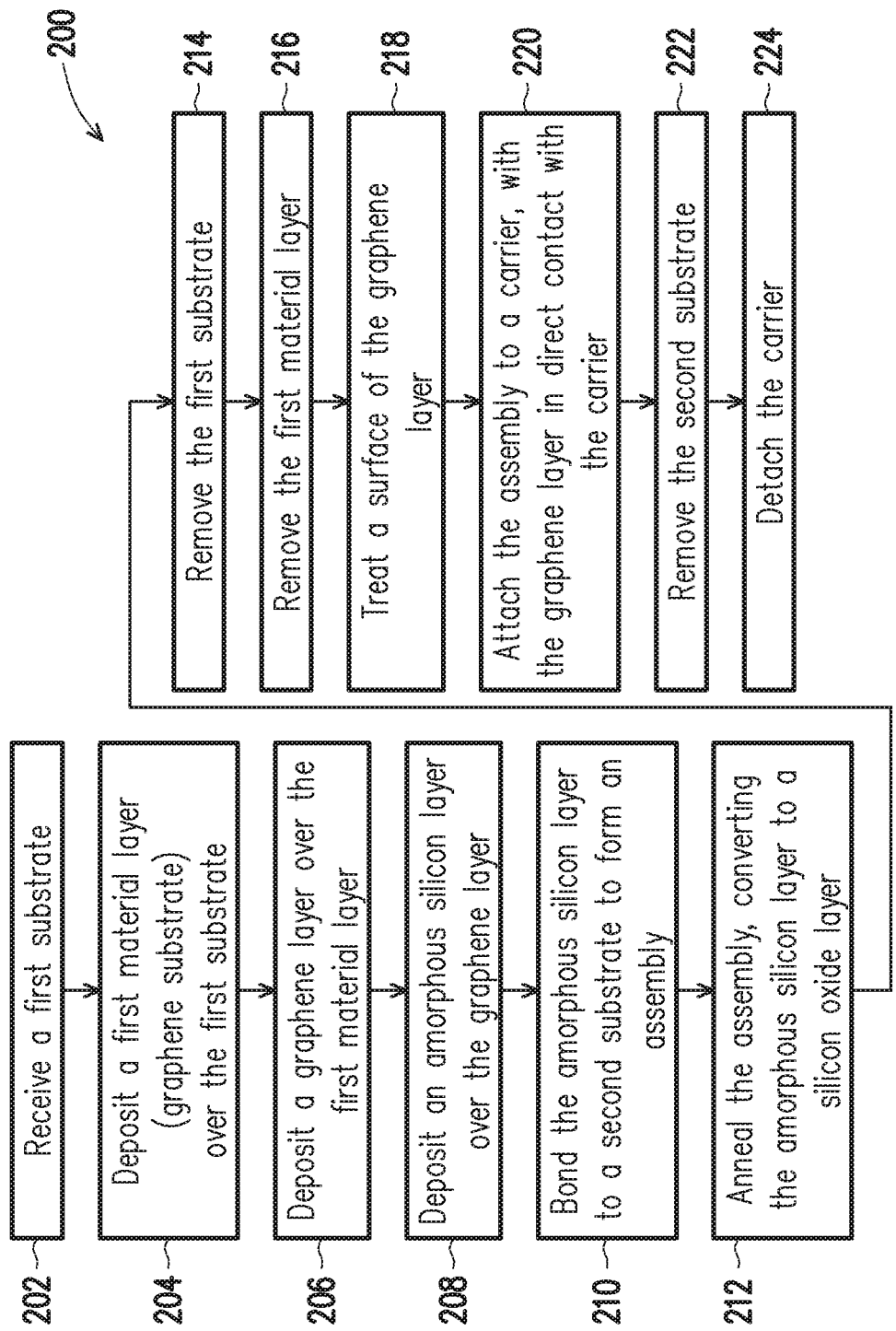
FIG. 2 is a flowchart illustrating a method of making a pellicle for use in a EUV lithography system, according to various aspects of the present disclosure.

FIG. 2 is a flow chart of a method 200 of making a pellicle having a graphene layer according to various aspects of the present disclosure. Additional operations can be provided before, during, and after the method 200, and some operations described can be replaced, eliminated, or moved around for additional embodiments of the method. The method 200 is an example, and is not intended to limit the present disclosure beyond what is explicitly recited in the claims.

Figure 3A:
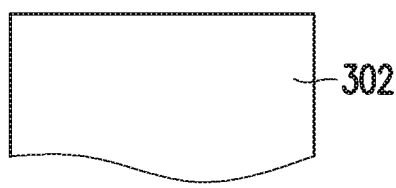
FIGS. 3A, 3B, 3C, 3D, 3E, 3F, 3G, 3H, 3I, 3J, 3K, and 3L are cross-sectional views of an apparatus during various fabrication stages, according to some embodiments of the present disclosure.

At operation 202, the method 200 (FIG. 2) receives a first substrate 302 (FIG. 3A). In the present embodiment, the first substrate 302 is a silicon substrate, i.e. it is a substrate comprising silicon. The silicon may be single crystalline silicon or polycrystalline silicon. In an embodiment, the first substrate 302 is a silicon wafer, such as an eight inch wafer or a twelve inch wafer. In another embodiment, the first substrate 302 is a portion of a silicon wafer. In alterative embodiments, the first substrate 302 may comprise silicon nitride, or one or more III-V semiconductors such as gallium arsenide. In an embodiment, the first substrate 302 may be round or rectangular depending on a dimension of a target pellicle. In various embodiments, the substrate 302 may be of few microns to few hundreds of microns thick.

Figure 3B:
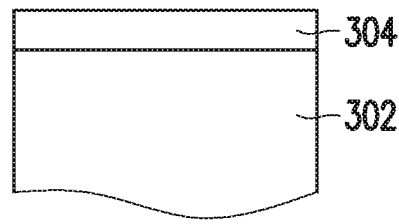

At operation 204, the method 200 (FIG. 2) deposits a first material layer 304 over the first substrate 302, as illustrated in FIG. 3B. The first material layer 304 is also referred to as a "graphene substrate" as it is used for depositing a graphene layer thereon. In the present embodiment, the first material layer 304 comprises nickel (Ni). Therefore, it is also referred to as a nickel layer 304. In the present embodiment, the nickel layer 304 is deposited by sputtering and has a thickness in a range from 50 to 500 nanometers (nm), such as from 50 to 100 nm. In another embodiment, the nickel layer 304 has a thickness of about 100 nm. In alternative embodiments, the first material layer 304 may comprise silicon, copper, glass, aluminum, cobalt, iron, steel, gold, platinum, titanium, molybdenum, gallium, ruthenium, silver, tungsten, iridium, or ceramics. In various embodiments, the first material layer 304 may be deposited by any suitable methods such as chemical vapor deposition (CVD), physical vapor deposition (PVD), and plating. Further, the first material layer 304 comprises a different material or a different composition than the substrate 302. In some embodiments, an additional layer may be formed between the substrate 302 and the first material layer 304. For example, a silicon oxide layer may be formed between the silicon substrate 302 and the nickel layer 304.

Figure 3C:
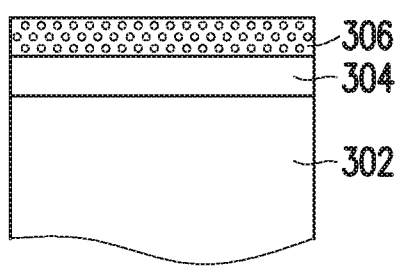

At operation 206, the method 200 (FIG. 2) deposits a graphene layer 306 over the first material layer 304 (FIG. 3C). In the present embodiment, the graphene layer 306 comprises a single layer graphene or a multilayer graphene (including bilayer or more than two layers). The graphene layer 306 is deposited using chemical vapor deposition (CVD) in the present embodiment. For example, the CVD process may involve four stages. In the first stage, a reduction gas such as $H_2$ is introduced into a reaction chamber with a suitable flow rate such as from 10 sccm (standard cubic centimeter per minute) to 1,000 sccm. The reaction chamber may be set to a suitable temperature such as from 600 to 1,000 degrees Celsius. In the second stage, carbon segregation occurs from the bulk of the first material layer 304 (e.g., nickel) to the surface of the first material layer 304. In the third stage, carbon precipitation occurs as a result of a decrease of the chamber temperature. In the fourth stage, the grain boundaries of the first material layer 304 serve as active sites for the growth of the graphene layer 306 while the chamber is being cooled down. For example, the reaction chamber may be cooled down at a rate of 500 degrees Celsius per minute to 5 degrees Celsius per minute. The graphene layer 306 may also be deposited using other methods known in the art. In the present embodiment, the graphene layer 306 has a thickness in a range from 5 to 50 nm such as from 5 to 10 nm. For example, the graphene layer 306 may be deposited to about 5 nm thick. For another example, the graphene layer 306 may be deposited to about 20 nm thick. The thickness of the graphene layer 306 can be designed according to the wavelength of the EUV radiation to be used. On the one hand, a thicker graphene layer absorbs more EUV radiation than a thinner graphene layer does for the same EUV wavelength. Therefore, it is desirable to have a graphene layer that is sufficiently thin for maximizing EUV pass-through efficiency. On the other hand, graphene is relatively brittle, having a relatively low fracture toughness compared to many metallic materials. Therefore, it is desirable to have a graphene layer that is thick enough to avoid breakages during the pellicle's manufacturing, assembling, and handling processes.

Figure 3D:
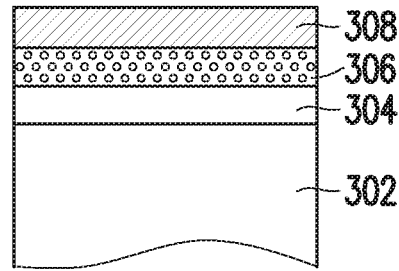

At operation 208, the method 200 (FIG. 2) deposits a layer 308 over the graphene layer 306 (FIG. 3D). The layer 308 comprises amorphous silicon ($\alpha$-Si), and is therefore also referred to as the amorphous silicon layer 308. In the present embodiment, the amorphous silicon layer 308 is deposited using CVD with $SiH_4$ as the precursor gas at a temperature about 600 degrees Celsius (° C.) and under a pressure about 0.1 to 10 Torr. In alternative embodiments, the deposition of the amorphous silicon layer 308 may be performed at a temperature ranging from 560 to 640° C. As will be explained later, the amorphous silicon layer 308 will be converted to a silicon oxide layer and may become part of the pellicle membrane (i.e., the pellicle membrane may comprise both the graphene layer 306 and the silicon oxide layer), therefore, the thickness of the amorphous silicon layer 308 is also designed according to the wavelength of the EUV radiation to be used. In the present embodiment, the amorphous silicon layer 308 is deposited to a thickness in a range from 50 to 150 nm. In an embodiment, the amorphous silicon layer 308 is about 100 nm thick.

Figure 3E:
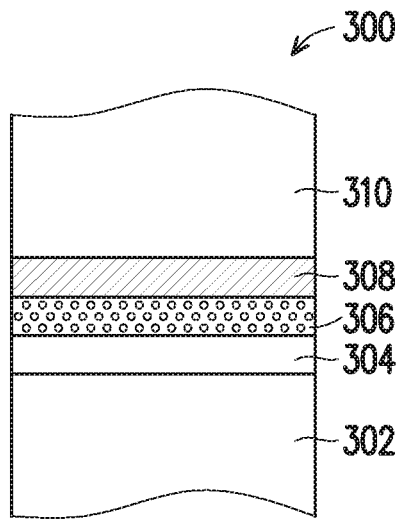

At operation 210, the method 200 (FIG. 2) bonds the amorphous silicon layer 308 to a second substrate 310, thereby forming an assembly 300 (FIG. 3E). In the present embodiment, the second substrate 310 comprises silicon, i.e., it is a silicon substrate. The silicon substrate 310 may comprise single crystalline silicon or polycrystalline silicon. In an embodiment, the silicon substrate 310 is a silicon wafer, such as an eight inch wafer or a twelve inch wafer. In another embodiment, the second substrate 310 is a part of a silicon wafer. In alterative embodiments, the second substrate 310 may comprise silicon nitride, or one or more III-V semiconductors such as gallium arsenide. The first and second substrates 302 and 310 may be of the same or different shapes. In the present embodiment, the amorphous silicon layer 308 is bonded to the second substrate 310 by van der Waals force.

Figure 3F:
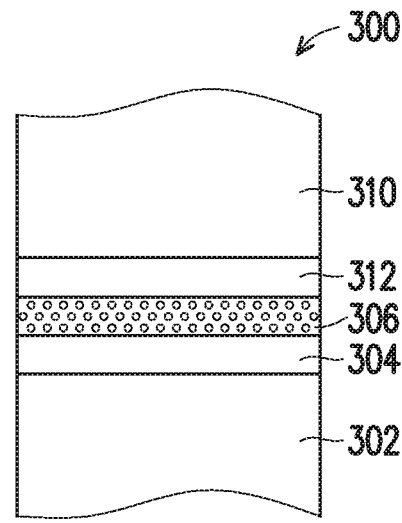

At operation 212, the method 200 (FIG. 2) anneals the assembly 300, thereby converting the amorphous silicon layer 308 to a silicon oxide layer 312 (FIG. 3F). In the present embodiment, the assembly 300 is annealed at a temperature in a range from 600 to 1,000° C., and in an ambient having oxygen. The annealing process converts the amorphous silicon layer 308 to a layer 312 that comprises primarily silicon oxide ($SiO_2$). The layer 312 is also referred to as the silicon oxide layer 312. In addition, the annealing process strengthens the bond between the second substrate 310 and the silicon oxide layer 312, which benefits subsequent processes, for example, processes performed to the first substrate 302 and the nickel layer 304.

At operation 214, the method 200 (FIG. 2) removes the first substrate 302 from the assembly 300. In an embodiment, operation 214 includes a grinding process or a chemical mechanical polishing (CMP) process followed by one or more etching processes. To further this embodiment, the grinding process or the CMP process partially removes the first substrate 302 until only a thin layer of the first substrate 302 remains in the assembly 300. For example, the remaining layer of the first substrate 302 may be of 30 to 50 angstroms (Å) thick. This prevents the grinding process or the CMP process from inadvertently removing the first material layer 304 and damaging the graphene layer 306. In an embodiment, operation 214 uses a timer to determine when to stop the above grinding process or CMP process. Subsequent to the grinding process or the CMP process, operation 214 removes the remaining layer of the first substrate 302 using an etching process, which may be a wet etching or a dry etching. The etching process is selective to the first substrate 302 and stops at the first material layer 304. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. In an embodiment, the first substrate 302 comprises silicon and the first material layer 304 comprises nickel, the etching process may use potassium hydroxide (KOH) solution as the wet etchant, which selectively etches silicon but not nickel. Alternatively, the etching process may use a fluorine-containing gas (e.g., $CF_4$, $SF_6$, $CH_2F_2$, $CHF_3$, and/or $C_2F_6$) in a dry etching process. The fluorine-containing gas selectively etches silicon but not nickel.

Figure 3G:
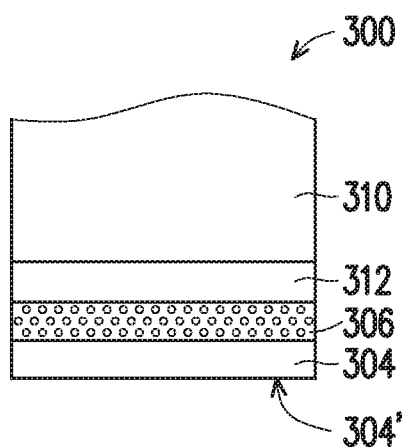

In another embodiment, operation 214 removes the entire first substrate 302 using a dry etching process (i.e., without using a grinding process, a CMP process, or a wet etching process). The dry etching process is selective to the first substrate 302 and stops at the first material layer 304. The etching gas may be one or more of the gases discussed above. In an embodiment, the first substrate 302 comprises silicon and the first material layer 304 comprises nickel, the dry etching process may use a fluorine-containing gas (e.g., $CF_4$, $SF_6$, $CH_2F_2$, $CHF_3$, and/or $C_2F_6$) to selectively remove the silicon substrate 302 and stops at the nickel layer 304. In yet another embodiment, operation 214 may use a wet etching process to remove the entire first substrate 302, using one or more of the wet etchant discussed above. After the first substrate 302 is removed from the assembly 300 using, for example, one of the above embodiments, a surface 304' of the first material 304 is exposed, as shown in FIG. 3G.

Figure 3H:
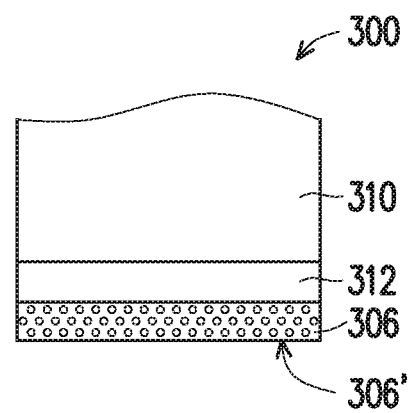

At operation 216, the method 200 (FIG. 2) removes the first material layer 304 from the assembly 300. In an embodiment, prior to removing the first material layer 304, operation 216 cleans the exposed surface 304' of the first material layer 304. This removes any residues from the prior processes, such as the grinding, polishing, and/or etching of the first substrate 302. Subsequently, operation 216 removes the first material layer 304 using one or more etching processes. In an embodiment, the first material layer 304 comprises nickel (therefore it is a "nickel layer 304") and operation 216 removes the nickel layer 304 by dipping the assembly 300 in a wet etchant containing ferric chloride ($FeCl_3$). In another embodiment, operation 216 removes the nickel layer 304 using a dry etching process with a chlorine-containing gas as the etching gas. For example, the dry etching process may supply chlorine gas and oxygen gas into an etching chamber where the assembly 300 is placed, and produce inductively coupled plasma that etches away the nickel layer 304. For another example, the dry etching process may supply boron trichloride ($BCl_3$) gas and argon gas into an etching chamber where the assembly 300 is placed, and produce inductively coupled plasma that etches away the nickel layer 304. After the first material layer 304 is removed from the assembly 300, a surface 306' of the graphene layer 306 is exposed, as shown in FIG. 3H.

Figure 3I:
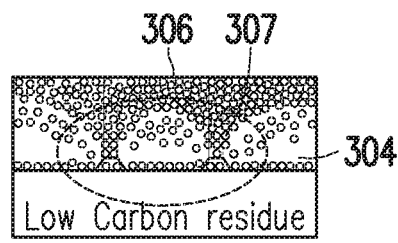

At operation 218, the method 200 (FIG. 2) cleans or treats the exposed surface 306' to improve the quality of the graphene layer 306. When the graphene layer 306 is deposited onto the first material layer 304 at operation 206, some carbon atoms 307 may diffuse into the grain boundaries of the first material layer 304, as shown in FIG. 3I. As a result, the surface 306' may comprise carbon residues after the first material layer 304 is removed. Operation 218 applies oxygen plasma to the surface 306' of the graphene layer 306. The oxygen plasma removes the carbon residues, if any, and smooth out the surface 306', improving the purity and flatness of the graphene layer 306.

Figure 3J:
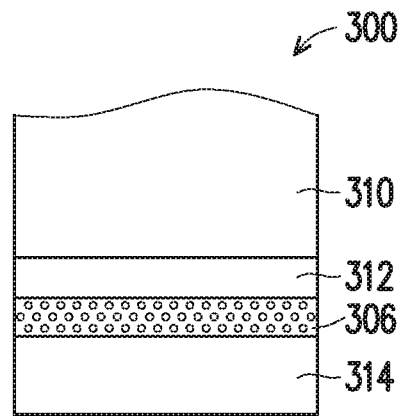

At operation 220, the method 200 (FIG. 2) attaches the assembly 300 to a carrier 314 (FIG. 3J). In an embodiment, the graphene layer 306, more particularly the surface 306', is in direct contact with the carrier 314. In an embodiment, the carrier 314 is an adhesive-less carrier and uses electrostatic charges as the mechanism for the attachment. For example, the carrier 314 may be made of ceramic and powered by one or more batteries which are used for generating the electrostatic charges. In addition, the carrier 314 may attach to the graphene layer 306 only along a perimeter of the carrier 314 (e.g., a brim of the carrier 314). For example, the carrier 314 may be in a shape of a cup (e.g., a suction cup), and only the brim of the cup is in direct contact with the graphene layer 306 when the assembly 300 is attached to the carrier 314. In an embodiment, the brim of the carrier 314 conforms to the shape of the pellicle such that the graphene layer 306 is stretched flat in the subsequent manufacturing processes. One benefit of using the carrier 314 is that it can be attached to and detached from the graphene layer 306 at ease without damaging the graphene layer 306.

Figure 3K:
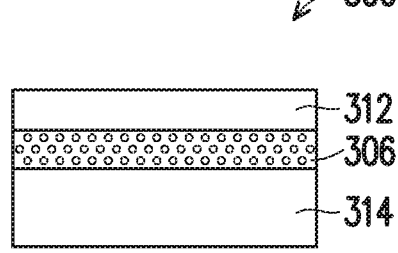

At operation 222, the method 200 (FIG. 2) removes the second substrate 310 from the assembly 300. In an embodiment, operation 222 removes the second substrate 310 using a dry etching process. For example, the dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. In addition, the dry etching process is controlled to remove the second substrate 310 while keeping the silicon oxide layer 312 over the graphene layer 306 (FIG. 3K). In another embodiment, operation 222 removes the second substrate 310 using a grinding process or a chemical mechanical polishing (CMP) process followed by one or more etching processes. To further this embodiment, operation 222 may control the grinding process or the CMP process with a timer such that the grinding process or the CMP process does not inadvertently remove the silicon oxide layer 312.

Referring to FIG. 3K, shown therein is the assembly 300 attached to the carrier 314. The assembly 300 includes the graphene layer 306 and the silicon oxide layer 312 disposed over the graphene layer 306. In an embodiment, the method 200 may further remove the silicon oxide layer 312, for example, by a dry etching process, and leave only the graphene layer 306 stretchily attached to the carrier 314. To further this embodiment, the method 200 may subsequently mount a pellicle frame (such as the pellicle frame 111 in FIG. 1) to the graphene layer 306, and then detach the carrier 314 from the graphene layer 306 (operation 224).

Figure 3L:
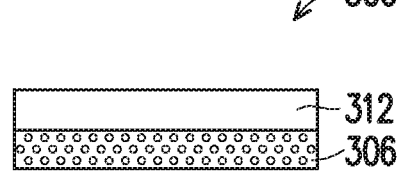

At operation 224, the method 200 (FIG. 2) removes the carrier 314, resulting in the assembly 300 as shown in FIG. 3L. The assembly 300 has the graphene layer 306 and the silicon oxide layer 312 together functioning as a pellicle membrane (such as the pellicle membrane 109 in FIG. 1). For example, a pellicle frame (such as the pellicle frame 111) may be mounted to the assembly 300 to make a pellicle 107 (FIG. 1). The pellicle frame may be mounted to the graphene layer 306 or to the silicon oxide layer 312. When the pellicle frame is mounted to the graphene layer 306, the silicon oxide layer 312 becomes an outer layer of the pellicle membrane and the graphene layer 306 becomes the inner layer of the pellicle membrane. Alternatively, when the pellicle frame is mounted to the silicon oxide layer 312, the graphene layer 306 becomes an outer layer of the pellicle membrane and the silicon oxide layer 312 becomes the inner layer of the pellicle membrane.

In the above process, the graphene layer 306 is always supported by at least one film or apparatus, such as the first material layer 304, the amorphous silicon layer 308, the silicon oxide layer 312, and the carrier 314. Therefore, the graphene layer 306 is always stretched and its shape remains substantially the same throughout the process. As a result, the graphene layer 306 is substantially free of wrinkles and breakages. Furthermore, embodiments of the present disclosure employ various dry etching processes, which advantageously maintain the graphene layer 306 free of wrinkles and breakages. Still further, embodiments of the present disclosure can be implemented for large-volume production of pellicles or pellicle membranes using graphene. These are non-limiting benefits provided by the embodiments of the present disclosure.

In one exemplary aspect, the present disclosure is directed to a method. The method includes depositing a first material layer over a first substrate; and depositing a graphene layer over the first material layer. The method further includes depositing an amorphous silicon layer over the graphene layer and bonding the amorphous silicon layer to a second substrate, thereby forming an assembly. The method further includes annealing the assembly, thereby converting the amorphous silicon layer to a silicon oxide layer. The method further includes removing the first substrate from the assembly and removing the first material layer from the assembly, thereby exposing the graphene layer.

In another exemplary aspect, the present disclosure is directed to a method. The method includes depositing a nickel layer over a first silicon substrate; and depositing a graphene layer over the nickel layer. The method further includes depositing an amorphous silicon layer over the graphene layer and bonding the amorphous silicon layer to a second silicon substrate by van der Waals force, thereby forming an assembly. The method further includes annealing the assembly in an ambient having oxygen, thereby converting the amorphous silicon layer to a silicon oxide layer. The method further includes removing the first silicon substrate from the assembly; removing the nickel layer from the assembly; attaching the assembly to a carrier with the graphene layer in direct contact with the carrier; and removing the second silicon substrate from the assembly after the attaching of the assembly to the carrier.

In yet another exemplary aspect, the present disclosure is directed to a method. The method includes depositing a nickel layer over a first substrate; and depositing a graphene layer over the nickel layer. The method further includes depositing an amorphous silicon layer over the graphene layer; and bonding the amorphous silicon layer to a second substrate, thereby forming a first assembly. The method further includes converting the amorphous silicon layer to a silicon oxide layer in the first assembly; removing the first substrate and the nickel layer from the first assembly; and attaching a carrier to the graphene layer, thereby forming a second assembly. The method further includes removing the second substrate from the second assembly.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
depositing a first material layer over a first substrate;
depositing a graphene layer over the first material layer;
depositing an amorphous silicon layer over the graphene layer;
bonding the amorphous silicon layer to a second substrate, thereby forming an assembly;
annealing the assembly, thereby converting the amorphous silicon layer to a silicon oxide layer;
removing the first substrate from the assembly; and
removing the first material layer from the assembly, thereby exposing the graphene layer.

2. The method of claim 1, further comprising:
attaching the assembly to a carrier with the graphene layer in direct contact with the carrier; and
after the attaching of the assembly to the carrier, removing the second substrate from the assembly.

3. The method of claim 1, wherein each of the first and second substrates comprises silicon, and the first material layer comprises nickel.

4. The method of claim 1, wherein the removing of the first substrate includes a dry etching process.

5. The method of claim 1, wherein the removing of the first material layer includes a dry etching process.

6. The method of claim 1, after the removing of the first material layer, further comprising:
applying oxygen plasma to a surface of the graphene layer opposite another surface of the graphene layer that interfaces with the silicon oxide layer.

7. The method of claim 1, wherein the removing of the second substrate includes a dry etching process.

8. The method of claim 1, wherein the graphene layer has a thickness ranging from 5 to 50 nm, and the amorphous silicon layer has a thickness ranging from 50 to 150 nm.

9. The method of claim 1, wherein the annealing of the assembly is performed at a temperature in a range from 600 to 1000 degrees Celsius and in an ambient having oxygen.

10. The method of claim 1, wherein the amorphous silicon layer is bonded to the second substrate by van der Waals force.

11. A method, comprising:
depositing a nickel layer over a first silicon substrate;
depositing a graphene layer over the nickel layer;
depositing an amorphous silicon layer over the graphene layer;
bonding the amorphous silicon layer to a second silicon substrate by van der Waals force, thereby forming an assembly;
annealing the assembly in an ambient having oxygen, thereby converting the amorphous silicon layer to a silicon oxide layer;
removing the first silicon substrate from the assembly;
removing the nickel layer from the assembly;
attaching the assembly to a carrier with the graphene layer in direct contact with the carrier; and
after the attaching of the assembly to the carrier, removing the second silicon substrate from the assembly.

12. The method of claim 11, wherein each of the removing of the first silicon substrate and the removing of the second silicon substrate includes a dry etching process.

13. The method of claim 11, after the removing of the nickel layer and before the attaching of the assembly to the carrier, further comprising:
applying oxygen plasma to a surface of the graphene layer opposite another surface of the graphene layer that interfaces with the silicon oxide layer.

14. The method of claim 11, wherein the removing of the first silicon substrate includes a chemical mechanical polishing (CMP) process.

15. The method of claim 11, wherein the assembly is attached to the carrier by electrostatic charges.

16. A method, comprising:
depositing a nickel layer over a first substrate;
depositing a graphene layer over the nickel layer;
depositing an amorphous silicon layer over the graphene layer;
bonding the amorphous silicon layer to a second substrate, thereby forming a first assembly;
converting the amorphous silicon layer to a silicon oxide layer in the first assembly;
removing the first substrate and the nickel layer from the first assembly;
attaching a carrier to the graphene layer, thereby forming a second assembly; and
removing the second substrate from the second assembly.

17. The method of claim 16, wherein the removing of the first substrate and the nickel layer includes a dry etching process, and the removing of the second substrate includes another dry etching process.

18. The method of claim 16, wherein the depositing of the nickel layer is by sputtering, and the nickel layer has a thickness ranging from 50 to 500 nm.

19. The method of claim 16, wherein the graphene layer has a thickness ranging from 5 to 50 nm, and the amorphous silicon layer has a thickness ranging from 50 to 150 nm.

20. The method of claim 16, after the removing of the first substrate and the nickel layer, further comprising:
   applying oxygen plasma to a surface of the graphene layer.

* * * * *